Figure 1:
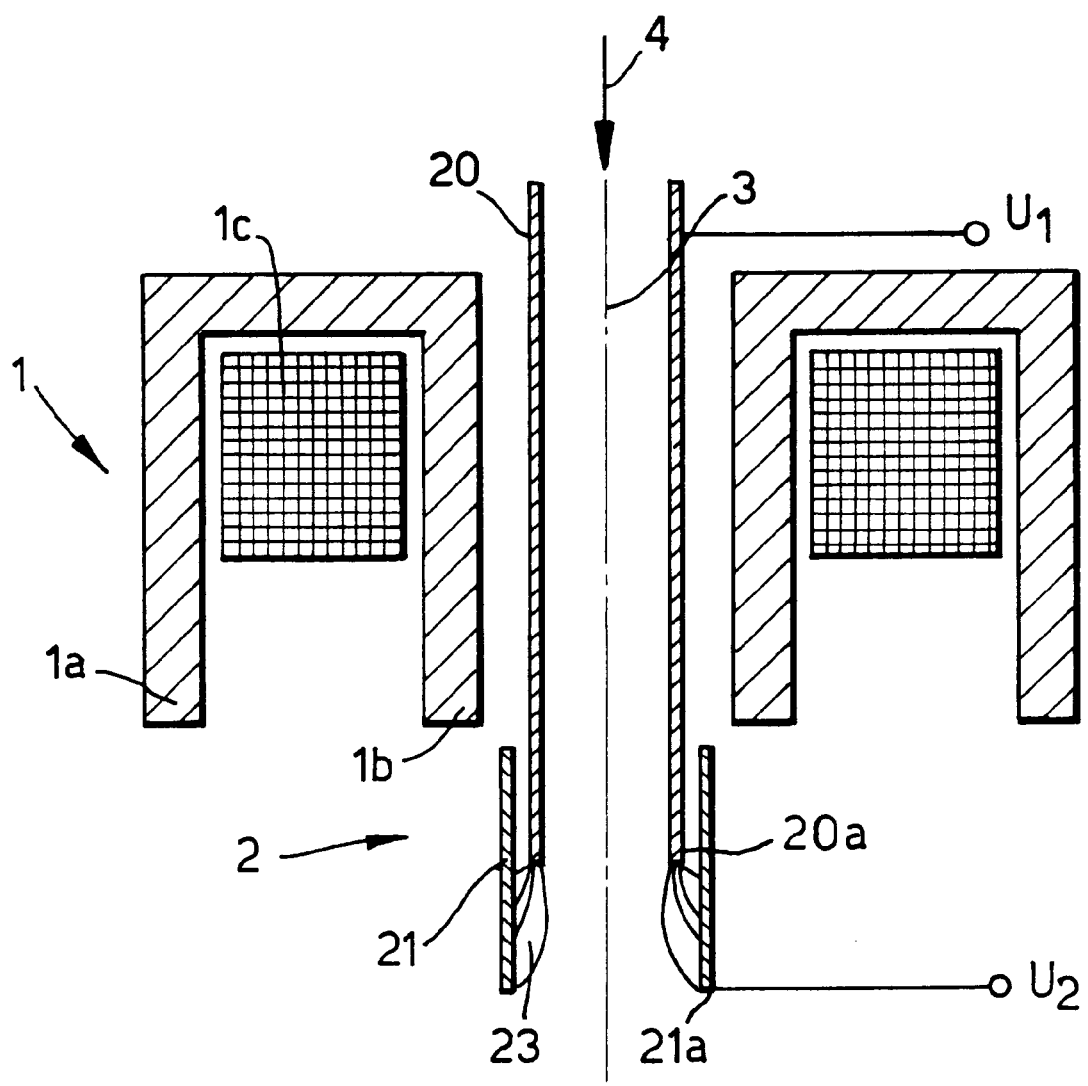

United States Patent [19]
Frosien et al.

[11] Patent Number: 6,104,034
[45] Date of Patent: Aug. 15, 2000

[54] OBJECTIVE LENS

[75] Inventors: Jürgen Frosien, Riemerling; Stefan Lanio, Erding; Gerald Schönecker, Munich, all of Germany

[73] Assignee: Advantest Corporation, Tokyo, Japan

[21] Appl. No.: 09/112,953

[22] Filed: Jul. 9, 1998

[30] Foreign Application Priority Data

Sep. 29, 1997 [EP] European Pat. Off. .............. 97116910

[51] Int. Cl.[7] .............................. G21K 1/08; H01J 3/14; H01J 3/26
[52] U.S. Cl. ................. 250/396 R; 250/396 ML
[58] Field of Search ............... 250/396 ML, 310, 250/396 R, 281, 288

[56] References Cited

U.S. PATENT DOCUMENTS

| | | | |
|---|---|---|---|
| 4,789,787 | 12/1988 | Parker | 250/396 |
| 5,663,560 | 9/1997 | Sakairi et al. | 250/281 |
| 5,780,859 | 7/1998 | Feuerbaum et al. | 250/396 R |
| 5,895,917 | 4/1999 | Ueda et al. | 250/310 |
| 5,942,758 | 8/1999 | Park | 250/396 R |

FOREIGN PATENT DOCUMENTS 0 790 634 A1  8/1997  European Pat. Off. .

*Primary Examiner*—Seungsook Ham
*Assistant Examiner*—John Patti
*Attorney, Agent, or Firm*—Reising, Ethington, Barnes, Kisselle; Learman & McCulloch, P.C.

[57] ABSTRACT

The invention relates to an objective lens for influencing a particle beam, particularly an electron beam with a magnetic single-pole lens and an electrostatic lens having a first and a second electrode which can be supplied with different potentials. The objective lens is characterized in that the electrostatic lens is disposed after the magnetic single-pole lens in the direction of the particle beam.

13 Claims, 6 Drawing Sheets

OBJECTIVE LENS

The invention relates to an objective lens for influencing a particle beam, provided particularly an electron beam, with a magnetic single-pole lens and an electrostatic lens having a first and a second electrode which can be supplied with different potentials.

BACKGROUND OF THE INVENTION

Objective lenses of the general class to which the invention relates are used for example in electron beam probing and in other spheres of application of electron beam devices, such as microscopy, inspection, lithography, etc. The high-resolution objective lenses should have low aberration coefficients particularly in the low-voltage range.

Therefore combined electric-magnetic pole piece objective lenses are known in the art which have low aberration coefficients and accordingly good low-voltage properties.

An improvement to these known objective lenses is disclosed in EP-A-0 790 634, in which the magnetic lens is formed by a single-pole lens, an electrostatic retarding lens being disposed within the magnetic lens.

The object of the invention is to improve the known objective lenses in such a way that even lower aberration coefficients are achieved.

SUMMARY OF THE INVENTION

According to the invention this object is achieved by disposing the electrostatic lens downstream of the magnetic single-pole lens in the direction of the particle.

In a preferred embodiment the two electrodes of the electrostatic lens are constructed as tube electrodes, the first electrode being passed through the single-pole lens and the second electrode being disposed coaxially with the first electrode.

By a slotted construction of one of the two electrodes, electrical multi-pole elements can be formed in a simple manner which can be connected and used for example as electrostatic deflectors, stigmators or other correcting elements.

THE DRAWINGS

Figure 2A:
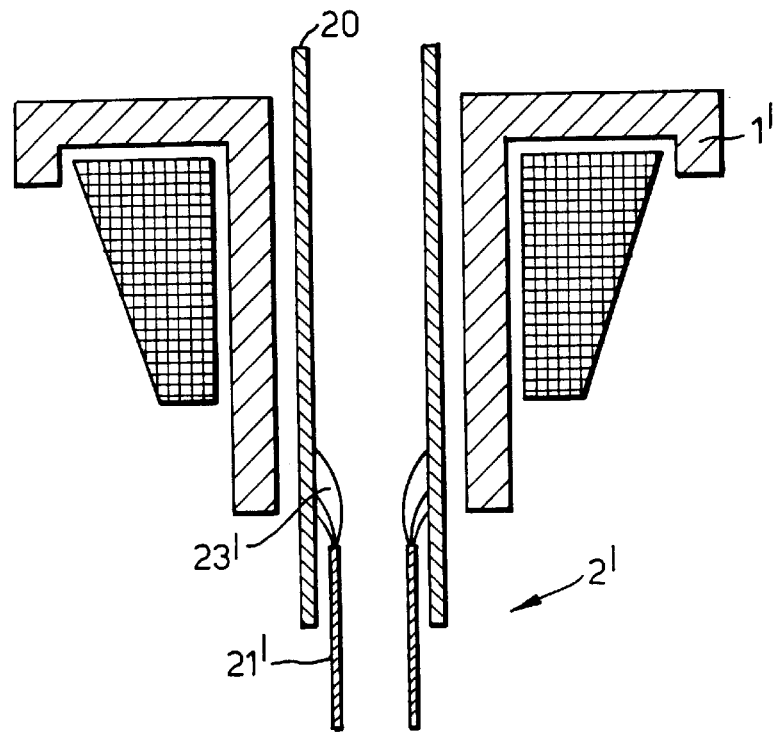
Figure 2B:
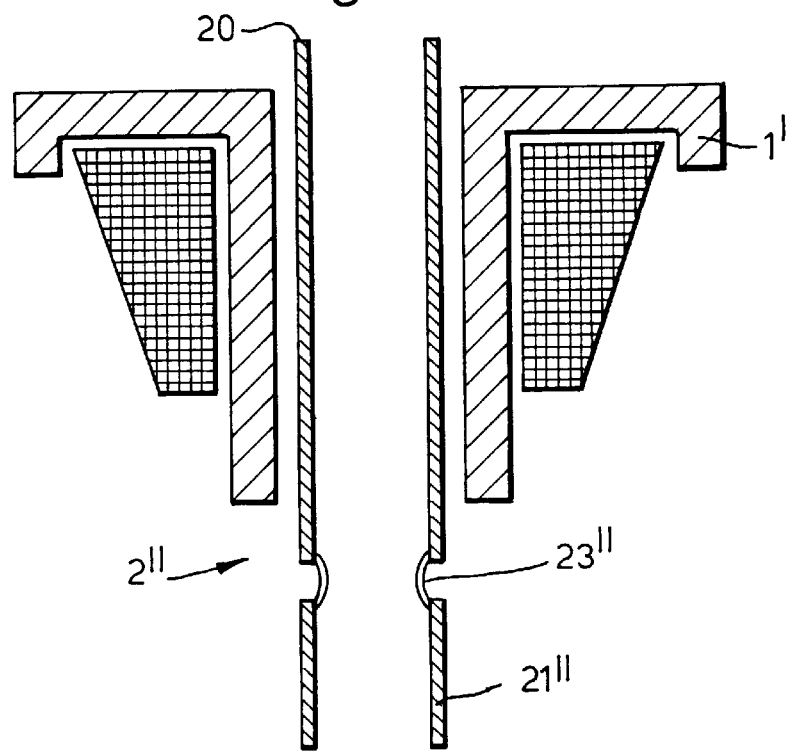
Figure 3A:
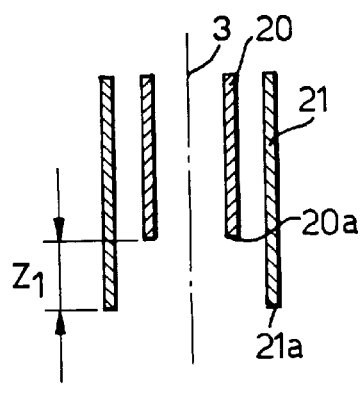
Figure 3B:
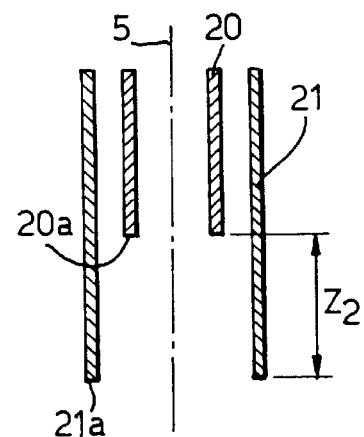
Figure 4:
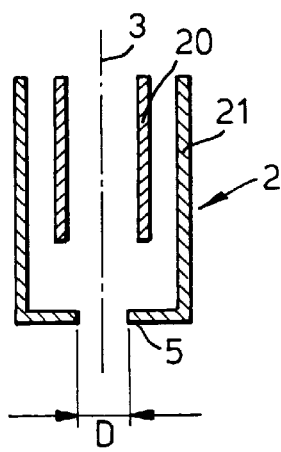
Figure 5:
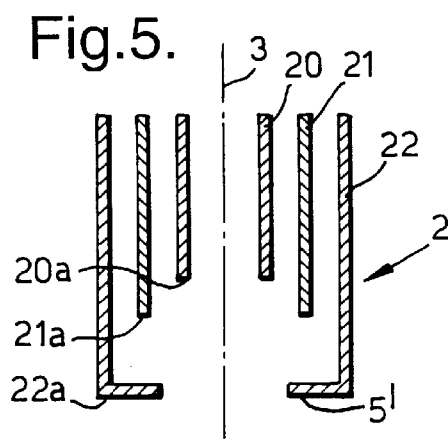
Figure 6A:
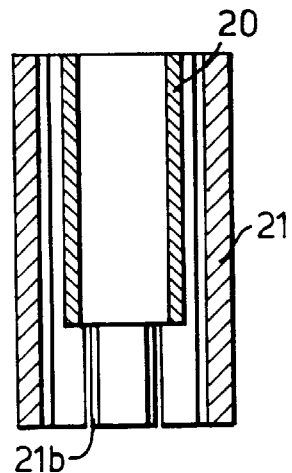
Figure 6B:
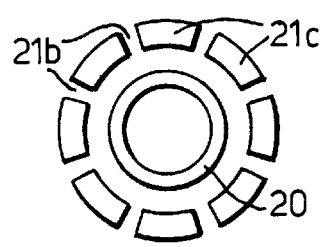
Figure 7A:
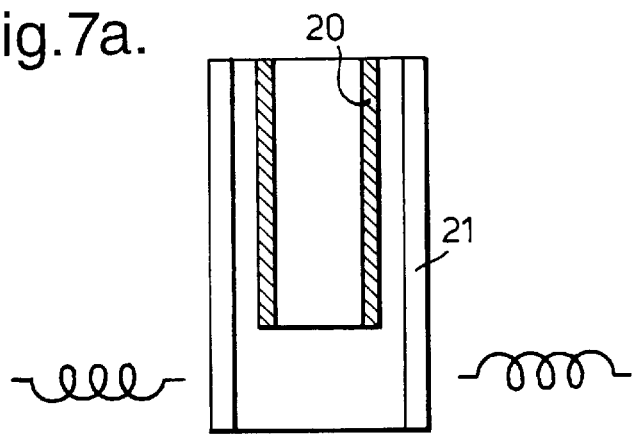
Figure 7B:
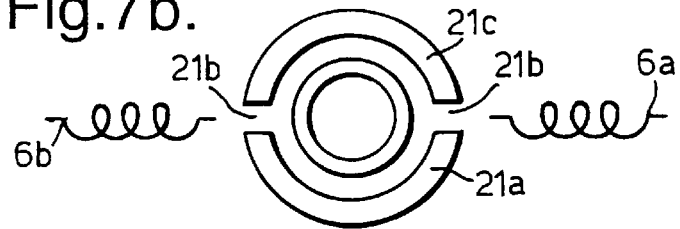
Figure 8A:
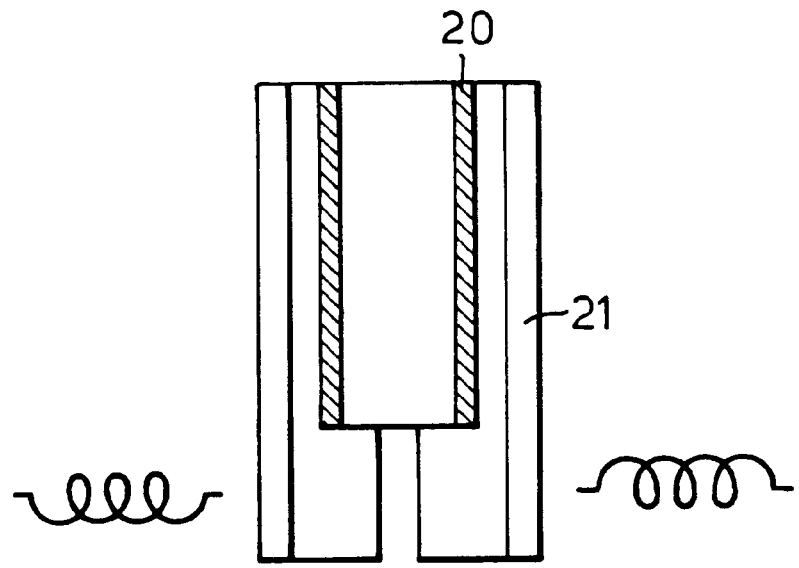
Figure 8B:
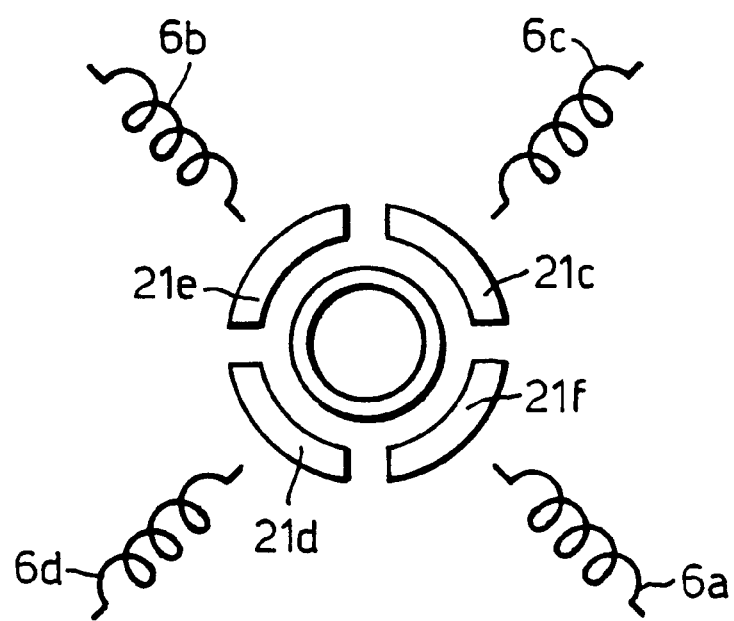
Figure 9:
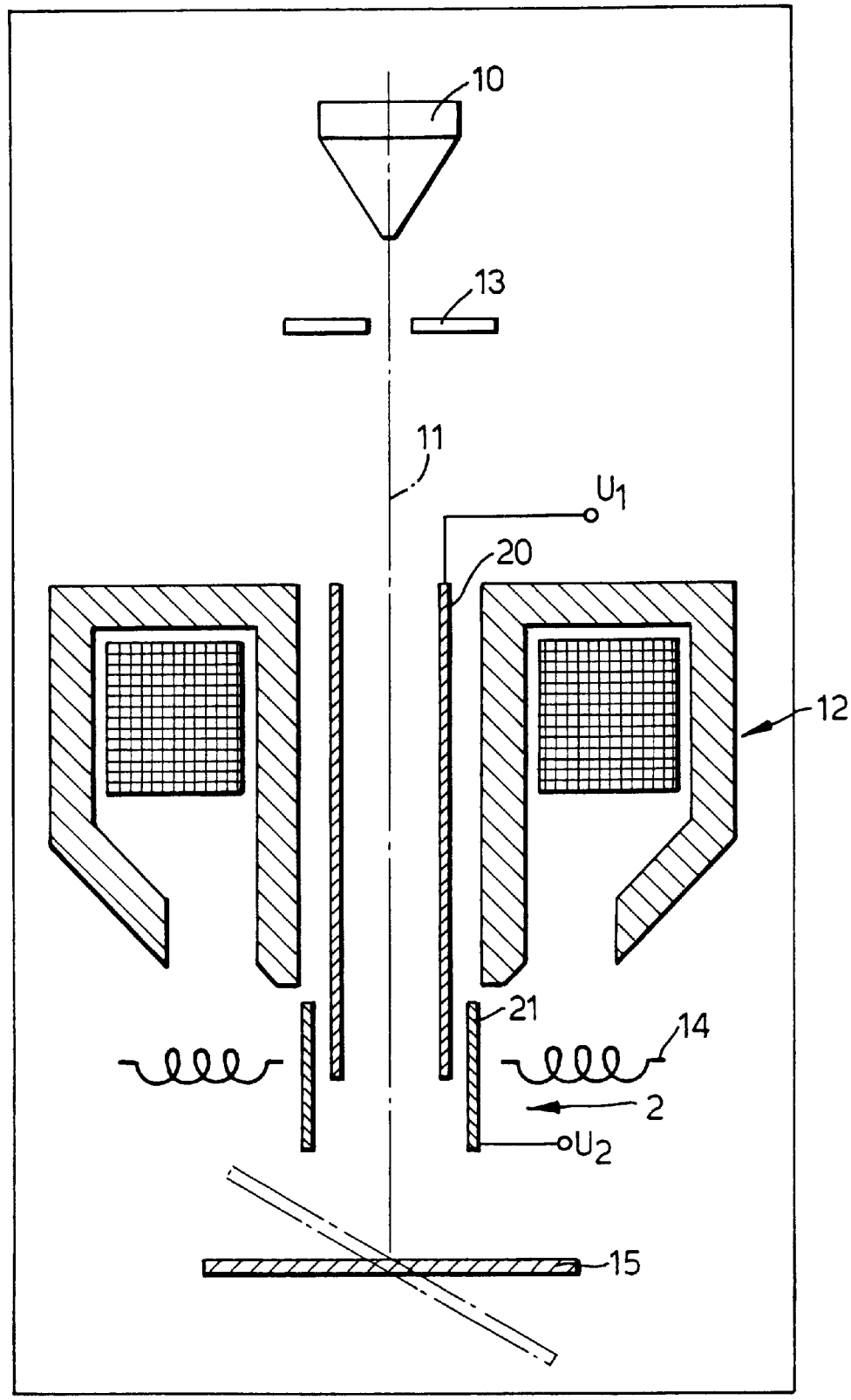

Further embodiments and advantages of the invention are explained in greater detail below with reference to the drawings, in which:

FIG. 1 shows a schematic representation of the objective lens according to a first embodiment, FIG. 2a shows a schematic representation of the objective lens according to a second embodiment, FIG. 2b shows a schematic representation of the objective lens according to a third embodiment, FIGS. 3a, 3b show schematic representations of the electrostatic lens in two different settings, FIG. 4 shows a schematic representation of the electrostatic lens according to a second embodiment, FIG. 5 shows a schematic representation of the electrostatic lens according to a third embodiment, FIG. 6a shows a schematic representation of the electrostatic lens with slotted electrode to form electrical multi-pole elements, FIG. 6b shows a view from below of the electrostatic lens according to FIG. 6a, FIG. 7a shows a schematic representation of an electrostatic lens with electrical and magnetic multipoles according to a first embodiment, FIG. 7b shows a view from below of the electrostatic lens according to FIG. 7a, FIG. 8a shows a schematic representation of an electrostatic lens with electrical and magnetic multipoles according to a second embodiment, FIG. 8b shows a view from below of the electrostatic lens according to FIG. 8a and FIG. 9 shows a schematic representation of a particle beam device.

THE PREFERRED EMBODIMENTS

The objective lens illustrated in FIG. 1 for influencing a particle beam, particularly an electron beam, consists of a magnetic single-pole lens 1 and an electrostatic lens 2 having a first electrode 20 and a second electrode 21 which can be supplied with different potentials. The magnetic lens 1 has a first and a second pole piece 1a, 1b and an excitation coil 1c.

The two electrodes 20, 21 are constructed as tube electrodes the first electrode 20 being passed through the single-pole lens 1 and projecting at its lower end 20a beyond the single-pole lens 1.

The second electrode 21 is disposed wholly beyond the lower end of the magnetic lens 1 and coaxially with the first electrode 20 in such a way that it partially overlaps or telescopes with the first electrode 20 and is larger in diameter. The electrostatic lens 2 forms a lens field 23 which propagates in the region of the lower end 20a of the first electrode 20 and the adjoining inner wall of the second electrode 21.

The objective lens has an optical axis 3 about which the single-pole lens 1 and the electrostatic lens 2 are disposed with rotational symmetry. A particle beam is indicated by an arrow 4.

The illustrated objective lens is distinguished in that the electrostatic lens 2 is disposed after or downstream of the magnetic single-pole lens 1 in the direction of the particle beam 4. Since the magnetic field is formed below the single-pole lens 1 and the electrical field likewise propagates below the single-pole lens, the electrical field is either in or below the magnetic field.

The electrostatic lens 2 is preferably operated as a retarding lens with regard to the particle beam 4.

In order to build up the retarding effect on the particle beam 4, the first electrode 20 is supplied with a first voltage $U_1$ and the second electrode 21 is supplied with a second voltage $U_2$, wherein the first voltage is for example 2 kV and the second voltage is between 0 and ±100 V, although higher voltages are also possible.

Thus the electrical retarding field does not act on the primary particle beam until this latter has been focussed by the magnetic field. As a result the aberration coefficients which cannot be avoided by the electrostatic lens can be kept relatively low.

The objective lens illustrated in FIG. 2a has a conically constructed single-pole magnetic lens 1' which is combined with an electrostatic lens 2'.

Such an objective lens is suitable in particular in particle beam devices with a large tiltable specimen stage, since further space for the tilting of the specimen is obtained by the conical construction of the single-pole lens.

The electrostatic lens 2' differs from the construction according to FIG. 1 in that the second electrode 21' is constructed with a smaller diameter than the first electrode 20 and projects from below into the first electrode 20. The lens field 23' forms here between the projecting end of the second electrode 21' and the adjoining wall of the first electrode 20.

Finally, in FIG. 2b a third variant of an electrostatic lens 2" is illustrated in which both the first electrode 20 and the second electrode 21" have the same diameter and are disposed spaced from one another. In this arrangement the lens field 23" which forms is provided in the transition region between the first and second electrodes.

In order to influence the electrostatic lens properties the two electrodes 20, 21 or 21' and 21" of the electrostatic lens 2 or 2', 2" can be disposed so that they are displaceable relative to one another in the direction of the optical axis. As a result, for example in the embodiment according to FIG. 1, the distance in the direction of the optical axis 3 between the lower end 20a and the lower end 21a of the two electrodes can be changed, so that the electrical field strength at the location of a specimen can also be adjusted.

In the illustrated embodiment of FIGS. 3a and 3b the two electrodes 20, 21 are shown with different distances $z_1$ or $z_2$. The first electrode 20 is immersed further into the second electrode 21 in FIG. 3a than is the case in the embodiment according to FIG. 3b.

A further possibility for influencing the electrostatic lens properties is shown in FIG. 4, in which the second electrode 21 is provided with an aperture 5. With differing aperture diameters D of the aperture the electrostatic lens can be adapted to the particular requirements.

The electrostatic lens 2 can also have in addition to the two electrodes 20, 21 a further, third electrode 22 which is again constructed as a tube electrode. In the embodiment according to FIG. 5 the third electrode 22 is disposed coaxially about the second electrode 21, its lower end 22a being spaced from the lower end 21a of the second electrode in the direction of the optical axis 3. The third electrode 22 is also provided here with an aperture 5'.

A further embodiment provides for the slotting of one of the two electrodes in multi-pole elements. In the embodiment illustrated in FIG. 6a the electrode 21 is provided with slots 21b. In the illustrated embodiment eight electrical multi-pole elements 21c are formed between the slots 21. By suitable application of voltages these electrical multi-pole elements 21c can be connected and used as electrostatic deflectors, stigmators or other correcting elements. In this case the individual voltages are chosen so that again an average voltage is produced which corresponds to the voltage $U_2$.

In the embodiment shown in FIGS. 7a, 7b the electrode 21 is provided with two slots 21b, so that two electrical multi-pole elements 21c, 21d are formed. Furthermore, a magnetic multi-pole element 6a, 6b formed by a suitable arrangement of coils or permanent magnets is disposed in each case outside the electrode 21.

With such an arrangement crossed electric/magnetic dipole transverse fields (Wien filters) can be generated. These can be adjusted in such a way that the primary particle beam 4 is not influenced, any secondary and backscattered electrons released on a specimen on the other hand are deflected and delivered to an off-axial in-lens or pre-lens detector which can detect both signals together or, by suitable construction, separately.

In the embodiment according to FIGS. 8a, 8b in each case four electrical multi-pole elements 21c, 21d, 21e, 21f and four magnetic multi-pole elements 6a, 6b, 6c, 6d are provided which can generate crossed electric/magnetic quadrupole transverse fields. These can be adjusted in such a way that the primary particle beam is not influenced but on the other hand the secondary and backscattered electrons can be split up and delivered to two off-axial in-lens or pre-lens detectors which can detect both signals together or, by suitable construction, separately. Within the scope of the invention electric/magnetic multi-pole fields of higher order can also be used.

The high-resolution objective lens described above is distinguished by low aberration coefficients particularly in the low-voltage range. It can therefore be used particularly advantageously in an electron beam device such as is illustrated by way of example in FIG. 9. It consists essentially of a source 10 for generating an electron beam 11 and an objective lens 12. In addition to further apertures which are not shown in greater detail, a blanking arrangement 13 in particular is also provided.

The objective lens 12 can be constructed as required according to FIGS. 1 to 8b. In the illustrated example a deflecting arrangement 14 is also provided in the region of the electrostatic lens in order to deflect the electron beam 11 on a specimen 15.

By interposition of a secondary electron spectrometer the objective lens can also be advantageously used in electron beam probing or in electron beam testing.

Due to the construction of the electrodes as tube electrodes the electrostatic lens 2 can also be designated as a snorkel lens, the small diameter of which especially in the proximity of the specimen offers a large amount of space which can be utilised for the mounting of detectors and other equipment as well as for tilting the specimen.

The electrical field strength at the location of the specimen, which can also be used for the extraction of secondary electrons and for the transfer to an in-lens or pre-lens detector can be adjusted according to the requirements either by the different depth of immersion of the first electrode 20 into the second electrode 21 or by an aperture of suitable size at the lower end of the second electrode 21.

The slotted construction of the electrode 21 according to FIGS. 6a to 8b offers the possibility that beam-influencing elements for deflection or correction of the primary electron beam or for influencing the secondary electrons can be easily combined with one another in an extremely space-saving manner, since this merely requires an addition of suitable voltages on the multi-pole elements or electrodes. As a result multi-functional elements can be very readily integrated into the objective lens, which was not usually possible with conventional arrangements for lack of space.

What is claimed is:

1. An objective lens construction for influencing an electron beam comprising:

a single-pole magnetic lens;

an electrostatic lens having a first electrode and a second electrode coaxial with said first electrode;

means for connecting said electrodes to a different electrical potentials; and one of said electrodes being at least partially accommodated in said magnetic lens and the other of said electrodes extending beyond said magnetic lens in the direction of said electron beam and being wholly external of said magnetic lens.

2. The construction according to claim 1 wherein each of said electrodes is tubular.

3. The construction according to claim 2 wherein one of said electrodes telescopes with the other of said electrodes.

4. The construction according to claim 1 wherein said electrodes are of corresponding cross sectional configuration and area.

5. The construction according to claim 1 wherein said objective lens has an optical axis about which the magnetic lens and said electrodes are symmetrical, said electrodes being displaceable relative to one another in the direction of said optical axis.

6. The construction according to claim 1 wherein said other of said electrodes is apertured at that end thereof remote from said magnetic lens.

7. The construction according to claim 1 wherein one of said electrodes is slotted axially and forms multipole elements.

8. The construction according to claim 7 wherein said slotted electrode constitutes an electrostatic deflector.

9. The construction according to claim 7 wherein said slotted electrode constitutes a stigmator.

10. The construction according to claim 7 including magnetic multipoles superimposed on electric multipole elements.

11. The construction according to claim 10 wherein said electric multipoles and said magnetic multipoles are of such number and are so arranged as to form crossed electric/magnetic dipole transverse fields.

12. The construction according to claim 10 wherein said electric multipoles and said magnetic multipoles are of such number and are so arranged as to form crossed electric/magnetic quadropole transverse fields.

13. The construction according to claim 1 wherein said electrostatic lens is operable to retard the particle beam.

* * * * *